United States Patent
Park et al.

(10) Patent No.: US 12,438,028 B2
(45) Date of Patent: Oct. 7, 2025

(54) SUBSTRATE SUPPORT UNIT, METHOD OF MANUFACTURING THE SAME, AND SUBSTRATE PROCESSING APPARATUS INCLUDING THE SAME

(71) Applicant: SEMES CO., LTD., Cheonan-si (KR)

(72) Inventors: Jun Seok Park, Cheonan-si (KR); Chul Ho Jung, Pyeongtaek-si (KR); Sang Kee Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 170 days.

(21) Appl. No.: 18/073,437

(22) Filed: Dec. 1, 2022

(65) Prior Publication Data

US 2023/0178409 A1 Jun. 8, 2023

(30) Foreign Application Priority Data

Dec. 2, 2021 (KR) ........................ 10-2021-0170956

(51) Int. Cl.
*H01L 21/683* (2006.01)
*H01L 21/324* (2006.01)
*H01L 21/67* (2006.01)
*H01L 21/687* (2006.01)

(52) U.S. Cl.
CPC ........ *H01L 21/6833* (2013.01); *H01L 21/324* (2013.01); *H01L 21/67103* (2013.01); *H01L 21/68757* (2013.01)

(58) Field of Classification Search
CPC .................................................. H01L 21/6833
See application file for complete search history.

(56) References Cited

U.S. PATENT DOCUMENTS

| | | | |
|---|---|---|---|
| 5,715,132 A | 2/1998 | Steger et al. | |
| 5,923,521 A | 7/1999 | Burkhart | |
| 9,909,197 B2 * | 3/2018 | Lee ................... | H01J 37/32568 |
| 2005/0099758 A1 * | 5/2005 | Kellerman .......... | H01L 21/6833 |
| | | | 361/234 |
| 2016/0181137 A1 | 6/2016 | Lee et al. | |

FOREIGN PATENT DOCUMENTS

| | | |
|---|---|---|
| JP | 09-129717 | 5/1997 |
| JP | 10-098092 | 4/1998 |
| JP | 2010-52015 | 3/2010 |
| KR | 10-2013-0099791 | 9/2013 |
| KR | 10-1585082 | 1/2016 |
| KR | 10-2016-0078220 | 7/2016 |
| KR | 10-2021-0120553 | 10/2021 |
| KR | 1020210120553 A * | 10/2021 |

OTHER PUBLICATIONS

Office Action of the Korean Intellectual Property Office dated Oct. 20, 2023.

* cited by examiner

*Primary Examiner* — Carson Gross

(57) ABSTRACT

Proposed is a substrate support unit, a method of manufacturing the same, and a substrate processing apparatus including the same. The substrate support unit includes a base component, a chucking component mounted on the base component, and an intermediate layer interposed between the base component and the chucking component, wherein the intermediate layer includes a joining part formed in a partial region to couple the base component and the chucking component.

13 Claims, 5 Drawing Sheets

SUBSTRATE SUPPORT UNIT, METHOD OF MANUFACTURING THE SAME, AND SUBSTRATE PROCESSING APPARATUS INCLUDING THE SAME

CROSS REFERENCE TO RELATED APPLICATION

The present application claims priority to Korean Patent Application No. 10-2021-0170956, filed Dec. 2, 2021, the entire contents of which is herein incorporated by reference.

BACKGROUND OF THE INVENTION

Field of the Invention

The present disclosure relates to a substrate support unit for supporting a substrate, a method of manufacturing the same, and a substrate processing apparatus including the same.

Description of the Related Art

In a substrate processing apparatus for semiconductor manufacturing, a substrate support unit such as an electrostatic chuck (ESC) is used to hold a substrate such as a silicon wafer in a chamber. The substrate is adsorbed and fixed to the surface of the electrostatic chuck by an electrostatic force generated by applying a voltage to an electrostatic electrode embedded in the electrostatic chuck. The electrostatic chuck includes a chucking component and a base component.

The chucking component is usually formed of a ceramic material such as alumina, and is manufactured in the form of joining a plurality of ceramic plates so that the electrostatic electrode and a heater are embedded. That is, the chucking component is fabricated as a joined body of a plurality of ceramic plates by sintering and joining the plurality of ceramic plates manufactured by tape casting. By coating the electrostatic electrode and the heater patterns before joining the plurality of ceramic plates, the electrostatic electrode and the heater may be embedded in the chucking component.

The chucking component is adhered to the metal base component including a refrigerant passage via a joining layer. The temperature of the substrate adsorbed and fixed to the electrostatic chuck is adjusted by the heater included in the chucking component and the refrigerant passage included in the base component.

Conventional joining layers generally include an organic bonder such as silicone or acryl. The organic bonder may prevent excessive cooling of the chucking component by the base component cooled by the refrigerant (thermal buffering effect), but has a problem of being vulnerable to high temperatures. The organic bonder has a heat resistance limit in processes operated at temperatures of 150° C. or higher, and its durability is easily reduced by plasma damage, and this deterioration phenomenon may cause non-uniformity in the overall temperature distribution of the electrostatic chuck. In addition, as the thermal buffering effect between the base plate and the chucking component decreases due to the deterioration phenomenon, the adhesive strength may be reduced at the joining interface between the chucking component and the base component, and distortion or warpage may occur.

As such, the organic bonder currently used has problems of life span reduction and a limit to the process temperature rise due to temperature non-uniformity of the electrostatic chuck caused by deterioration in thermal durability. There is also a problem that the organic bonder melts during the high-temperature processes.

SUMMARY OF THE INVENTION

Accordingly, the present disclosure has been made keeping in mind the above problems occurring in the related art, and the present disclosure is intended to provide a substrate support unit including an intermediate layer having a thermal buffering effect and stability at high temperatures.

In addition, an objective of the present disclosure is to provide a substrate support unit with adjustable heat transfer performance of the intermediate layer.

The objective of the present disclosure is not limited to the above, and other objectives and advantages of the present disclosure not mentioned may be understood by the following description.

In order to achieve the above objective, according to an embodiment of the present disclosure, there is provided a manufacturing method of a substrate support unit for supporting a substrate, the method including: preparing a chucking component for supporting the substrate and a base component disposed under the chucking component; and coupling a partial region of a bottom surface of the chucking component and a corresponding partial region of an upper surface of the base component by brazing.

In an embodiment, the coupling may include: metalizing the partial region of the bottom surface of the chucking component; and joining the metallized region and the upper surface of the base component by brazing.

In an embodiment, the metalizing may include: depositing a metal film on the bottom surface of the chucking component by vacuum deposition or plating. In addition, the metal film may be formed on the partial region of the bottom surface of the chucking component by patterning.

In an embodiment, the brazing may provide a metal filler between the chucking component and the base component, and couple the chucking component and the base component via the filler.

In an embodiment, the preparing may include: forming at least one gas injection part for supplying a gas to a space between the base component and the chucking component.

In an embodiment, the partial region may include a minimum area for coupling and fixing the base component and the chucking component. Accordingly, thermal stress due to a difference in thermal expansion coefficients between the base component and the chucking component may be minimized.

According to an embodiment of the present disclosure, there is provided a substrate support unit, including: a base component; a chucking component mounted on the base component; and an intermediate layer interposed between the base component and the chucking component, wherein the intermediate layer may include a joining part formed by brazing in a partial region to couple the base component and the chucking component.

In an embodiment, the joining part may be formed by metalizing the bottom surface of the chucking component and then joining with the base component by brazing. The joining part may formed only in a partial region of the intermediate layer.

In an embodiment, the joining part may be formed by metalizing a partial region of a bottom surface of the chucking component and then fixing the chucking component and the base component via a metal filler provided between the metalized region and the base component.

In an embodiment, the joining part may include a first area corresponding to an edge region of the base component and the chucking component.

In an embodiment, the joining part may include a second area corresponding to an edge region surrounding a plurality of holes passing through the base component and the chucking component.

In an embodiment, the intermediate layer may further include a heat transfer part having an inner space formed by the joining part.

In an embodiment, the base component may be provided with a gas injection part for injecting a heat transfer gas into the heat transfer part.

In an embodiment, a controller configured to control pressure of the heat transfer gas injected into the heat transfer part through the gas injection part may be further included.

In an embodiment, the heat transfer gas may be a helium gas.

According to an embodiment of the present disclosure, there is provided a substrate processing apparatus, including: a housing; a shower head unit installed inside the housing and configured to supply a process gas for processing a substrate into the housing; a substrate support unit installed under the shower head unit inside the housing; and a plasma generation unit configured to generate plasma using the process gas to process the substrate. The substrate support unit may include: a base component; a chucking component mounted on the base component; and an intermediate layer between the base component and the chucking component, wherein the intermediate layer may include a joining part formed by brazing in a partial region to couple the base component and the chucking component.

According to an embodiment of the present disclosure, the thermal stress of an intermediate layer can be minimized since the intermediate layer disposed between a base component and a chucking component includes a joining part formed by using a local metallization brazing method.

Moreover, according to an embodiment of the present disclosure, a thermal buffering effect can be improved as the intermediate layer includes a heat transfer part that is an enclosed space formed by the joining part, and by injecting a heat transfer gas into the heat transfer part.

Furthermore, the heat transfer performance of the heat transfer part can be adjusted by adjusting the pressure of the heat transfer gas injected into the heat transfer part.

The effects of the present disclosure are not limited to those mentioned above, and other effects not mentioned will be clearly understood by those skilled in the art from this specification and accompanying drawings.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
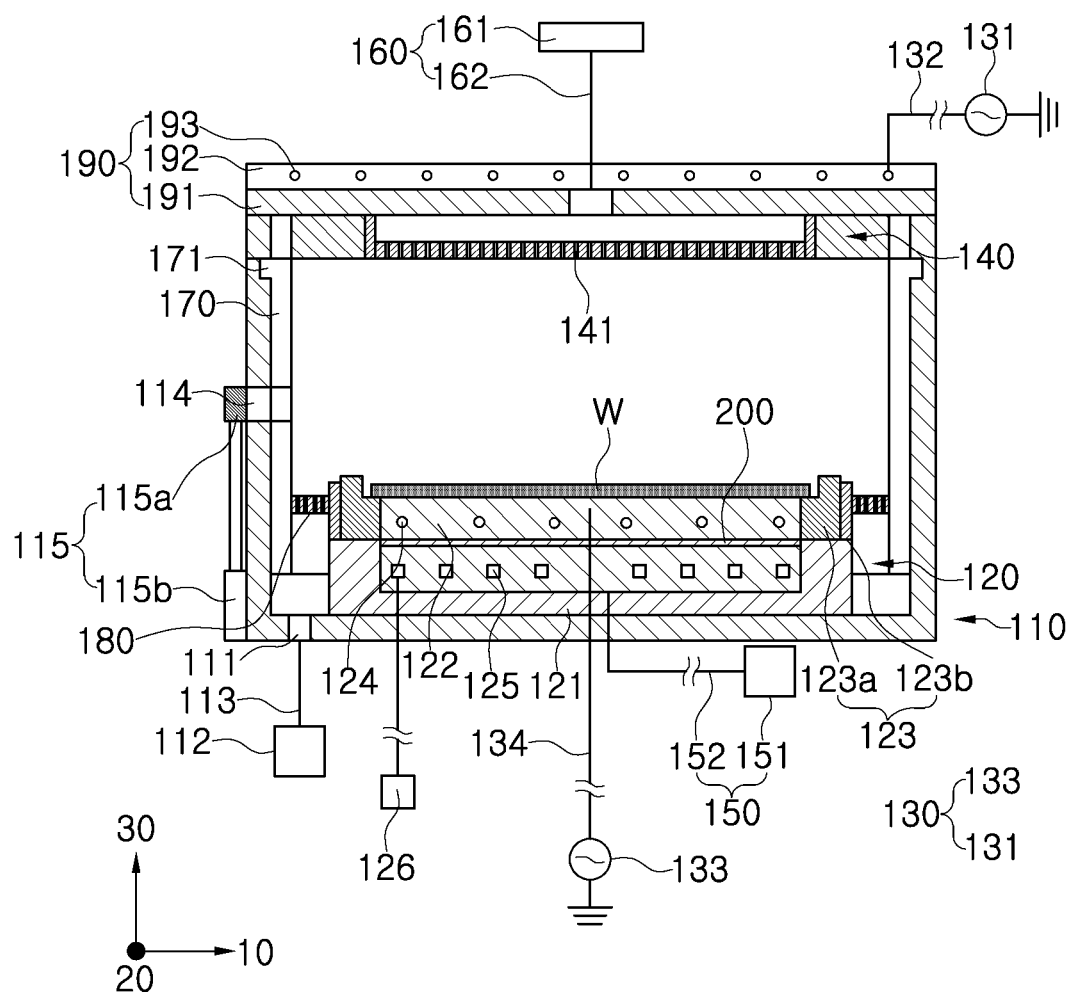
FIG. 1 is a cross-sectional view schematically illustrating a structure of a substrate processing apparatus according to an embodiment of the present disclosure.

Hereinafter, preferred embodiments of the present disclosure will be described in detail with reference to the accompanying drawings, so that those skilled in the art to which the present disclosure pertains may easily implement them. However, the present disclosure may be embodied in many different forms and is not limited to the embodiments described herein.

In describing the embodiment of the present disclosure, when it is determined that a detailed description of a related known function or configuration may unnecessarily obscure the gist of the present disclosure, the detailed description thereof will be omitted, and the same reference numerals are used throughout the drawings for parts having similar functions and actions.

At least some of the terms used in the specification are defined in consideration of functions in the present disclosure and may vary depending on user, operator intention, custom, etc. Therefore, the terms should be interpreted based on the content throughout the specification.

In addition, as used herein, a singular expression may include a plural expression unless the context clearly indicates otherwise. In the specification, when a certain component is included, this means that other components may be further included without excluding other components unless otherwise stated. When a part is said to be connected (or coupled) with another part, this includes not only the case where it is directly connected (or coupled) but also the case where it is indirectly connected (or coupled) with another part interposed therebetween.

Meanwhile, in the drawings, the size or shape of a component, the thickness of a line, etc. may be expressed somewhat exaggeratedly for the convenience of understanding.

Embodiments of the present disclosure are described with reference to a schematic illustration of ideal embodiments of the present disclosure. Accordingly, changes from the shape of the illustration, for example, changes in manufacturing methods and/or tolerances, are those that may be sufficiently expected. Therefore, the embodiments of the present disclosure are not to be described as being limited to the specific shapes of the areas described by way of illustration, but rather to include variations in shape, and the components described in the drawings are entirely schematic and their shapes are not intended to describe the precise shape of the components nor to limit the scope of the present disclosure.

When an element or layer is referred to as "on" another element or layer, it is not only directly on the other element or layer, but also when another layer or other element is interposed therebetween. On the other hand, reference to an element "directly on" indicates that no intervening element or layer is interposed.

Spatially relative terms such as "below", "beneath", "lower", "above", "upper" may be used to easily describe the correlation of one element or components with another element or components as shown in the drawings. The spatially relative terms should be understood as terms including different orientations of the element during use or operation in addition to the orientation shown in the drawings. For example, if the element shown in the figure is turned over, the element described as "beneath" or "beneath" another element may be placed "above" another element. Accordingly, the exemplary term "below" may include both orientations below and above. The element may also be oriented in other orientations, and thus the spatially relative terms may be interpreted according to orientation.

It should be understood that although first, second, etc. are used to describe various elements, components, and/or sections, these elements, components, and/or sections are not limited by these terms. These terms are only used to distinguish one element, component, or section from another element, component, or section. Therefore, the first element, first component or first section mentioned below may be the second element, second component or second section within the spirit of the present disclosure.

Hereinafter, embodiments of the present disclosure will be described in detail with reference to the accompanying drawings. In the description with reference to the accompanying drawings, regardless of reference numerals, the same or corresponding components are assigned the same reference numerals, and overlapping descriptions thereof will be omitted.

The present disclosure relates to a substrate support unit including: a joining part for locally joining a base component and a chucking component; and an intermediate layer with a heat transfer part formed by the locally present joining part. Particularly, the present disclosure relates to a substrate support unit capable of adjusting heat transfer performance and a substrate processing apparatus including the same. The heat transfer performance may be adjusted by regulating the pressure of a heat transfer gas injected into the heat transfer part formed by the joining part and securing high-temperature stability by the joining part formed by local metalized brazing. Hereinafter, the present disclosure will be described in detail with reference to the drawings and the like.

FIG. 1 is a cross-sectional view schematically illustrating a structure of a substrate processing apparatus according to an embodiment of the present disclosure.

Referring to FIG. 1, a substrate processing apparatus 100 may include a housing 110, a substrate support unit 120, a plasma generation unit 130, a shower head unit 140, a first gas supply unit 150, a second gas supply unit 160, a wall liner unit 170, a baffle unit 180, and an upper module 190.

The substrate processing apparatus 100 is a system for processing a substrate W (e.g., a wafer) using an etching process (e.g., a dry etching process) in a vacuum environment. The substrate processing apparatus 100 may process the substrate W using, for example, a plasma process.

The housing 110 provides a space in which the plasma process is performed. The housing 110 may have an exhaust hole 111 at a lower portion thereof.

The exhaust hole 111 may be connected to an exhaust line 113 on which a pump 112 is mounted. The exhaust hole 111 may discharge a reaction by-product generated during the plasma process and a gas remaining in the housing 110 to the outside of the housing 110 through the exhaust line 113. In this case, the inner space of the housing 110 may be decompressed to a predetermined pressure.

The housing 110 may have an opening 114 famed on the sidewall thereof. The opening 114 may function as a passage through which the substrate W enters and exits the housing 110. The opening 114 may be configured to be opened and closed by a door unit 115.

The door unit 115 may include an outer door 115a and a door actuator 115b. The outer door 115a is provided on the outer wall of the housing 110. The outer door 115a may move in the vertical direction (i.e., the third direction 30) by the door actuator 115b. The door actuator 115b may be operated using a motor, a hydraulic cylinder, a pneumatic cylinder, or the like.

The substrate support unit 120 is installed in the inner lower region of the housing 110. The substrate support unit 120 may hold the substrate W by electrostatic force. However, the present embodiment is not limited thereto. The substrate support unit 120 may provide support to the substrate W in various ways such as mechanical clamping, vacuum, and the like.

When the substrate support unit 120 supports the substrate W by electrostatic force, this may be implemented as an electrostatic chuck (ESC) including a base component 121, and a chucking component 122.

The base component 121 supports the chucking component. The base component 121 may be made from, for example, an aluminum material and provided as an aluminum base plate.

The chucking component 122 supports the substrate W seated thereon by using electrostatic force. The chucking component 122 may be made from a ceramic material and provided as a ceramic plate or a ceramic puck, and may be coupled to the base component 121 so as to be fixed on the base component 121.

An intermediate layer 200 may be formed between the base component 121 and the chucking component 122 formed thereon, and the intermediate layer 200 may include a joining part 210 for joining the base component 121 and the chucking component 122 to each other and a heat transfer part 220. A more detailed description of the intermediate layer 200 will be described later.

The chucking component 122 may be installed to be movable in the vertical direction (i.e., the third direction 30) inside the housing 110 by an actuating member (not shown). When the chucking component 122 is formed to be movable in the vertical direction as described above, it may be possible to position the substrate W in a region with more uniform plasma distribution.

A ring assembly 123 is provided to surround the edge of the chucking component 122. The ring assembly 123 may be provided in a ring shape and configured to support an edge region of the substrate W. The ring assembly 123 may include a focus ring 123a and an insulation ring 123b.

The focus ring 123a is formed inside the insulation ring 123b and is provided to surround the chucking component 122. The focus ring 123a may be made of a silicone material, and may focus plasma to the substrate W.

The insulation ring 123b is formed outside the focus ring 123a and is provided to surround the focus ring 123a. The insulation ring 123b may be made of a quartz material.

Meanwhile, the ring assembly 123 may further include an edge ring (not shown) formed in close contact with the edge of the focus ring 123a. The edge ring may be formed to prevent the side surface of the chucking component 122 from being damaged by plasma.

The first gas supply unit 150 supplies a first gas to remove foreign substances remaining on the upper portion of the ring assembly 123 or the edge portion of the chucking component 122. The first gas supply unit 150 may include a first gas supply source 151 and a first gas supply line 152.

The first gas supply source 151 may supply nitrogen gas ($N_2$ gas) as the first gas. However, the present embodiment is not limited thereto. The first gas supply source 151 may supply other gases, cleaning agents, and the like.

The first gas supply line 152 is provided at a position between the chucking component 122 and the ring assembly 123. The first gas supply line 152 may be connected to a position between the chucking component 122 and the focus ring 123a, for example.

On the other hand, the first gas supply line 152 may be provided inside the focus ring 123a and be bent to be connected to a position between the chucking component 122 and the focus ring 123a.

A heating member 124 and a cooling member 125 are provided so that the substrate W may maintain the process temperature while the etching process is in progress inside the housing 110. To this end, the heating member 124 may be provided as a heating wire, and the cooling member 125 may be provided as a cooling line through which a refrigerant flows.

The heating member 124 and the cooling member 125 may be installed inside the electrostatic chuck 120 to allow the substrate W to maintain the process temperature. For example, the heating member 124 may be installed inside the chucking component 122, and the cooling member 125 may be installed inside the base component 121.

Meanwhile, the cooling member 125 may be supplied with a refrigerant using a cooling device, that is, a chiller 126. The chiller 126 may be installed outside the housing 110.

A pin hole 127 is formed in the substrate support unit 120. The pin hole 127 may vertically penetrate the base component 121 and the chucking component 122. A plurality of pin holes 127 may be formed. The plurality of pin holes 127 may be disposed in a circumferential direction of the chucking component 122. For example, the three pin holes 127 may be disposed at intervals of 120 degrees in the circumferential direction of the chucking component 122. In addition, a variable number of pin holes 127 may be formed, such as four pin holes 127 arranged at intervals of 90 degrees in the circumferential direction of the chucking component 122.

A lift pin (not shown) may be accommodated in the pin hole 127. The lift pin (not shown) may load the substrate W into the chucking component 122 or unload the substrate W from the chucking component 122 through upward and downward movements. The lift pin (not shown) supports the substrate.

The lift pin is provided in plurality to correspond to the number of the pin holes 127, and the diameter of the lift pin is formed to be smaller than the diameter of the pin hole 127. To be specific, the diameter of the lift pin may be such that the lift pin does not contact the inner wall of the pin hole 127 when the lift pins and the pin holes 127 are arranged to have the same central axis.

The lift pins may be driven in the vertical direction by a separate actuating part.

The plasma generation unit 130 generates plasma from the gas remaining in the discharge space. The discharge space refers to a space above the electrostatic chuck 120 in the inner space of the housing 110.

The plasma generation unit 130 may generate plasma in the discharge space inside the housing 110 using an inductively coupled plasma (ICP) source. In this case, the plasma generation unit 130 may use an antenna unit 193 installed in the upper module 190 as an upper electrode and use the electrostatic chuck 120 as a lower electrode.

Figure 2:
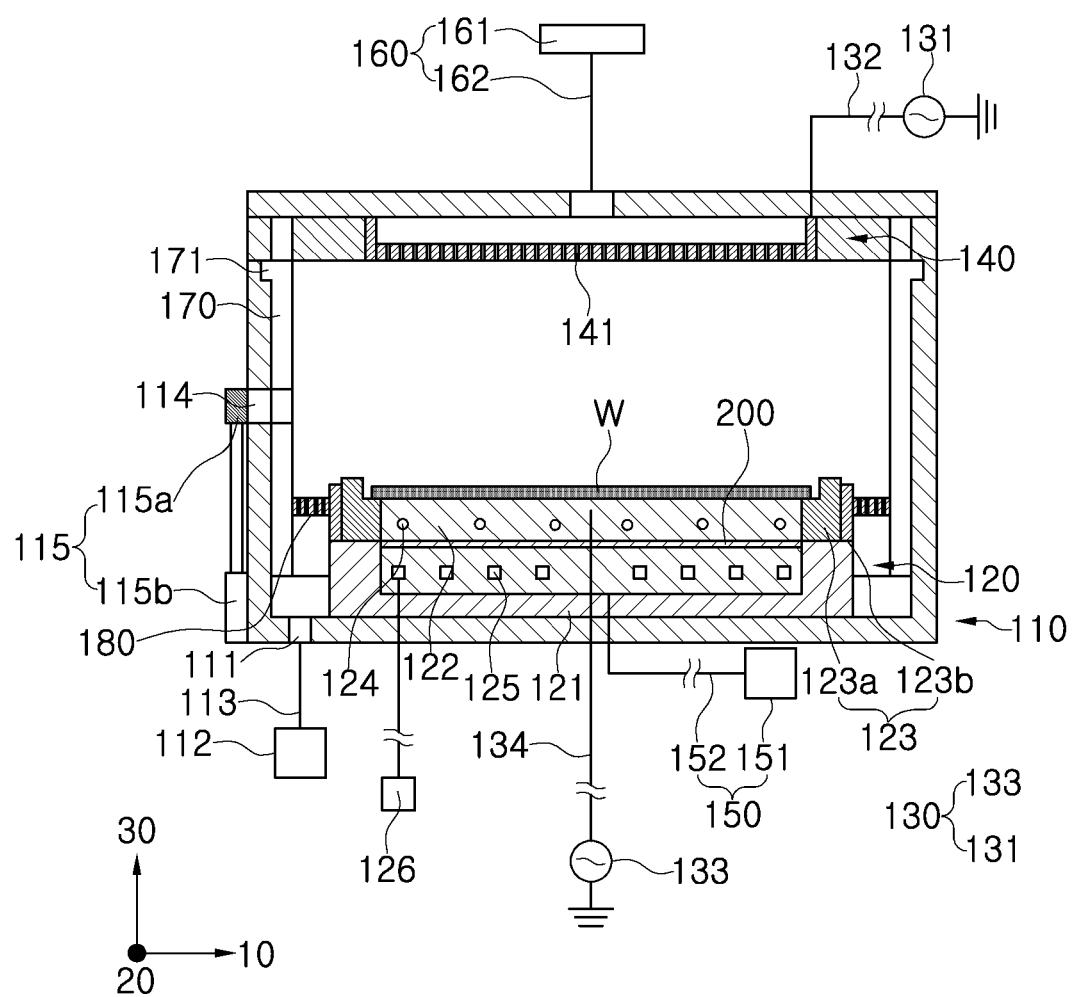
FIG. 2 is a cross-sectional view schematically illustrating a structure of a substrate processing apparatus according to another embodiment of the present disclosure.

However, the present embodiment is not limited thereto. The plasma generation unit 130 may also generate plasma in the discharge space inside the housing 110 using a capacitively coupled plasma (CCP) source. In this case, the plasma generation unit 130 may use the shower head unit 140 as an upper electrode and the electrostatic chuck 120 as a lower electrode as shown in FIG. 2. FIG. 2 is a cross-sectional view schematically illustrating a structure of a substrate processing apparatus according to another embodiment of the present disclosure.

It will be described again with reference to FIG. 1.

The plasma generation unit 130 may include an upper electrode, a lower electrode, an upper power source 131, and a lower power source 133.

The upper power source 131 applies power to the upper electrode, that is, the antenna unit 193. The upper power source 131 may be provided to control the characteristics of the plasma. The upper power source 131 may be provided to regulate, for example, ion bombardment energy.

Although a single upper power source 131 is illustrated in FIG. 1, a plurality of upper power sources 131 may be provided in this embodiment. When the plurality of upper power sources 131 are provided, the substrate processing apparatus 100 may further include a first matching network (not shown) electrically connected to the plurality of upper power sources.

The first matching network may match and apply frequency powers of different magnitudes input from respective upper power sources to the antenna unit 193.

Meanwhile, a first impedance matching circuit (not shown) may be provided on a first transmission line 132 connecting the upper power source 131 and the antenna unit 193 for the purpose of impedance matching.

The first impedance matching circuit may act as a lossless passive circuit to effectively (i.e., maximally) transfer electrical energy from the upper power source 131 to the antenna unit 193.

The lower power source 133 applies power to the lower electrode, that is, the electrostatic chuck 120. The lower power source 133 may serve as a plasma source for generating plasma, or may serve to control characteristics of plasma together with the upper power source 131.

Although a single lower power source 133 is shown in FIG. 1, a plurality of lower power sources 133 may be provided in this embodiment as in the upper power source 131. When the plurality of lower power sources 133 are provided, a second matching network (not shown) electrically connected to the plurality of lower power sources may be further included.

The second matching network may match and apply frequency powers of different magnitudes input from respective lower power sources to the electrostatic chuck 120.

Meanwhile, a second impedance matching circuit (not shown) may be provided on a second transmission line 134 connecting the lower power source 133 and the electrostatic chuck 120 for the purpose of impedance matching.

Like the first impedance matching circuit, the second impedance matching circuit may act as a lossless passive circuit to effectively (i.e., maximally) transfer electrical energy from the lower power source 133 to the electrostatic chuck 120.

The shower head unit 140 may be installed to face the electrostatic chuck 120 in the vertical direction inside the housing 110. The shower head unit 140 may include a plurality of gas feeding holes 141 to inject gas into the housing 110, and may have a larger diameter than the electrostatic chuck 120.

The shower head unit 140 may be made from a silicone material, and may also be made from a metal material.

The second gas supply unit 160 supplies a process gas (a second gas) to the inside of the housing 110 through the shower head unit 140. The second gas supply unit 160 may include a second gas supply source 161 and a second gas supply line 162.

The second gas supply source 161 supplies an etching gas as a process gas used to process the substrate W. The second gas supply source 161 may supply a gas containing a fluorine (e.g., a gas such as SF6 or CF4) as the etching gas.

A single second gas supply source 161 may be provided to supply the etching gas to the shower head unit 140. However, the present embodiment is not limited thereto. A plurality of second gas supply sources 161 may be provided to supply the process gas to the shower head unit 140.

The second gas supply line 162 connects the second gas supply source 161 and the shower head unit 140. The second gas supply line 162 transfers the process gas supplied through the second gas supply source 161 to the shower head unit 140 so that the etching gas may be introduced into the housing 110.

Meanwhile, when the shower head unit 140 is divided into a center zone, a middle zone, an edge zone, etc., the second gas supply unit 160 may further include a gas distributor (not shown) and a gas distribution line (not shown) to supply a process gas to each region of the shower head unit 140.

The gas distributor distributes the process gas supplied from the second gas supply source 161 to each region of the shower head unit 140. The gas distributor may be connected to the second gas supply source 161 through the second gas supply line 162.

The gas distribution line connects the gas distributor and each region of the shower head unit 140. Due to this, the gas distribution line may transfer the process gas distributed by the gas distributor to each region of the shower head unit 140.

Meanwhile, the second gas supply unit 160 may further include a third gas supply source (not shown) for supplying a deposition gas.

The third gas supply source is to protect the side surface of the substrate W pattern and supply it to the shower head unit 140 so that anisotropic etching is possible. The second gas source may supply a gas such as C4F8 or C2F4 as the deposition gas.

The wall liner unit 170 is for protecting the inner surface of the housing 110 from arc discharge generated while the process gas is excited, impurities produced during a substrate processing process, and the like. The wall liner unit 170 may be provided in a cylindrical shape in which an upper portion and a lower portion are opened inside the housing 110.

The wall liner unit 170 may be provided adjacent to the inner wall of the housing 110. The wall liner unit 170 may include a support ring 171 thereon. The support ring 171 is formed to protrude from the upper portion of the wall liner unit 170 in an outward direction (i.e., the first direction 10), and is placed on the upper end of the housing 110 to support the wall liner unit 170.

The baffle unit 180 serves to exhaust process by-products of plasma, unreacted gas, and the like. The baffle unit 180 may be installed between the inner wall of the housing 110 and the electrostatic chuck 120.

The baffle unit 180 may be provided in an annular ring shape, and may include a plurality of through holes penetrating in the vertical direction (i.e., the third direction 30). The baffle unit 180 may control the flow of the process gas according to the number and shape of the through holes.

The upper module 190 is installed to cover the open upper portion of the housing 110. The upper module 190 may include a window member 191, an antenna member 192, and an antenna unit 193.

The window member 191 is formed to cover the upper portion of the housing 110 in order to seal the inner space of the housing 110. The window member 191 may be provided in the shape of a plate (e.g., a disk), and may be formed of an insulation material (e.g., alumina ($Al_2O_3$)).

The window member 191 may be formed to include a dielectric window.

The window member 191 may have a through hole through which the second gas supply line 162 is inserted, and may have a coating film on the surface thereof to suppress the generation of particles when a plasma process is performed inside the housing 110.

The antenna member 192 is installed on the window member 191, and a space of a predetermined size may be provided so that the antenna unit 193 may be disposed therein.

The antenna member 192 may be formed in a cylindrical shape with an open lower portion, and may be provided to have a diameter corresponding to that of the housing 110. The antenna member 192 may be provided to be detachably attached to the window member 191.

The antenna unit 193 serves as an upper electrode and is equipped with a coil provided to foam a closed loop. The antenna unit 193 functions to generate a magnetic field and an electric field inside the housing 110 on the basis of the power supplied from the upper power source 131, and excite the gas introduced into the housing 110 through the shower head unit 140 into a plasma.

The antenna unit 193 may be equipped with a coil in the form of a planar spiral. However, the present embodiment is not limited thereto. The structure or size of the coil may be variously changed by a person skilled in the art.

Next, the intermediate layer formed between the upper chucking component and the lower base component will be described.

Figure 3:
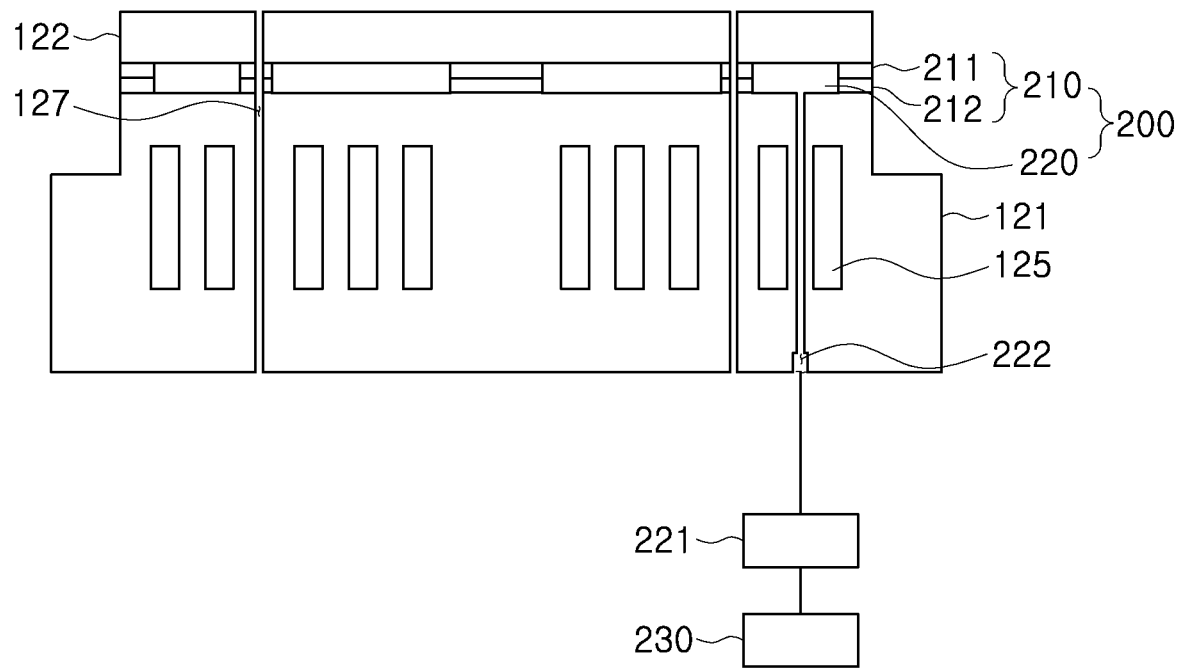
FIG. 3 is a cross-sectional view schematically illustrating a substrate support unit according to the embodiment of the present disclosure.
Figure 4:
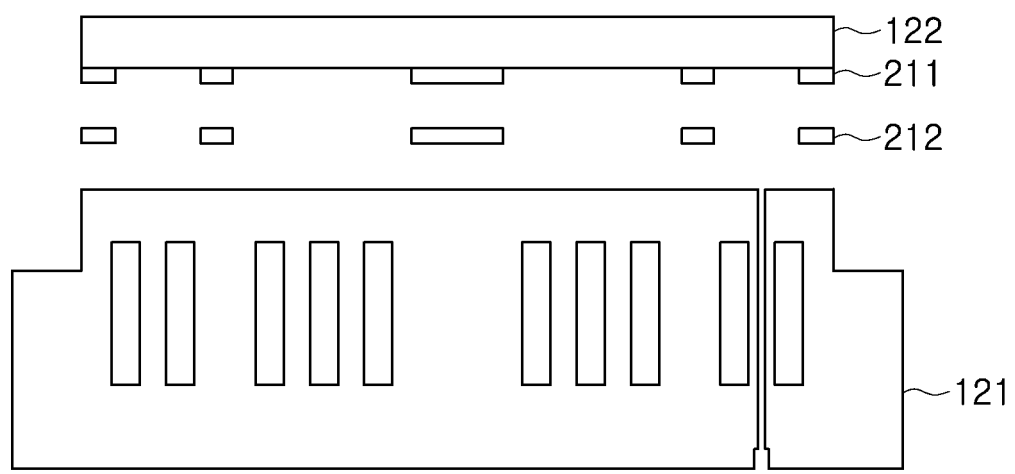
FIG. 4 is an exploded view schematically illustrating the components of FIG. 3.

FIGS. 3 and 4 are views schematically illustrating a substrate support unit according to the embodiment of the present disclosure. For convenience of description, some components of the substrate support unit are omitted. In addition, although the thickness of the joining part 210 is shown to be thick for convenience of description, it may be formed thinner in reality.

Referring to FIG. 3, the substrate support unit 120 may include the intermediate layer 200 between the base component 121 and the chucking component 122, and the intermediate layer 200 may include the joining part 210 and a heat transfer part 220. For example, the base component 121 may be an Al-based base plate, and the chucking component may be $Al_2O_3$-based ESC ceramics.

In the electrostatic chuck according to the embodiment of the present disclosure, the upper surface of the base component 121 and the lower surface of the chucking component 122 may have the same area. However, the present embodiment is not limited thereto.

The intermediate layer 200 may be formed between the base component 121 and the chucking component 122 to have an area corresponding to the upper area of the base component 121.

Alternatively, although not shown in detail, the intermediate layer 200 may be formed to have a smaller area than the upper surface of the base component 121. The intermediate layer 200 may be formed in a center region between the base component 121 and the chucking component 122.

The joining part 210 is a region where the base component 121 and the chucking component 122 are joined by brazing. The joining part 210 may be formed in a partial region of the intermediate layer 200 rather than in the entire region.

Referring to FIG. 4, the joining part 210 may be formed by metallizing a partial region of the bottom surface of the chucking component 122 made of a non-conductive material, and bonding the metallized region to the base component 121 by brazing. The metallization may be depositing a metal film 211 on the bottom surface of the chucking component 122 by vacuum deposition or plating. The metal film 211 may be formed by patterning on a partial region of the bottom surface of the chucking component 122. For example, the metal film 211 may be any one of aluminum (Al), copper (Cu), titanium (Ti), nickel (Ni), and silver (Ag) series.

A metal filler 212 may be provided to couple the metalized region of the bottom surface of the chucking component 122 to the base component 121 made of a conductive material. For example, the filler 212 may include aluminum (Al). The base component 121 may be coupled to a partial metalized region of the bottom surface of the chucking component 122 by performing a brazing process using the filler 212 as a medium. The brazing process will be described briefly. First, the filler 212 is inserted between the base component 121 and the chucking component 122 to be joined, and the filler 212 is heated to a temperature sufficient to melt, and then the molten filler 212 is cooled to form a strong joining part. The base component 121 and the chucking component 122 may be coupled by brazing. As the base component 121 and the chucking component 122 are coupled by brazing, the substrate support unit 120 may have great heat resistance during a high-temperature process.

The filler 212 may be made of a metal having a lower melting point than that of the metal film 211 on the bottom surface of the chucking component 122 and the base component 121.

Meanwhile, in order to minimize the thermal stress caused by the difference in coefficients of thermal expansion between the base component 121 and the chucking component 122, the joining part 210 may be formed in a minimum area in which the base component 121 and the chucking component 122 may be coupled and fixed.

Figure 5:
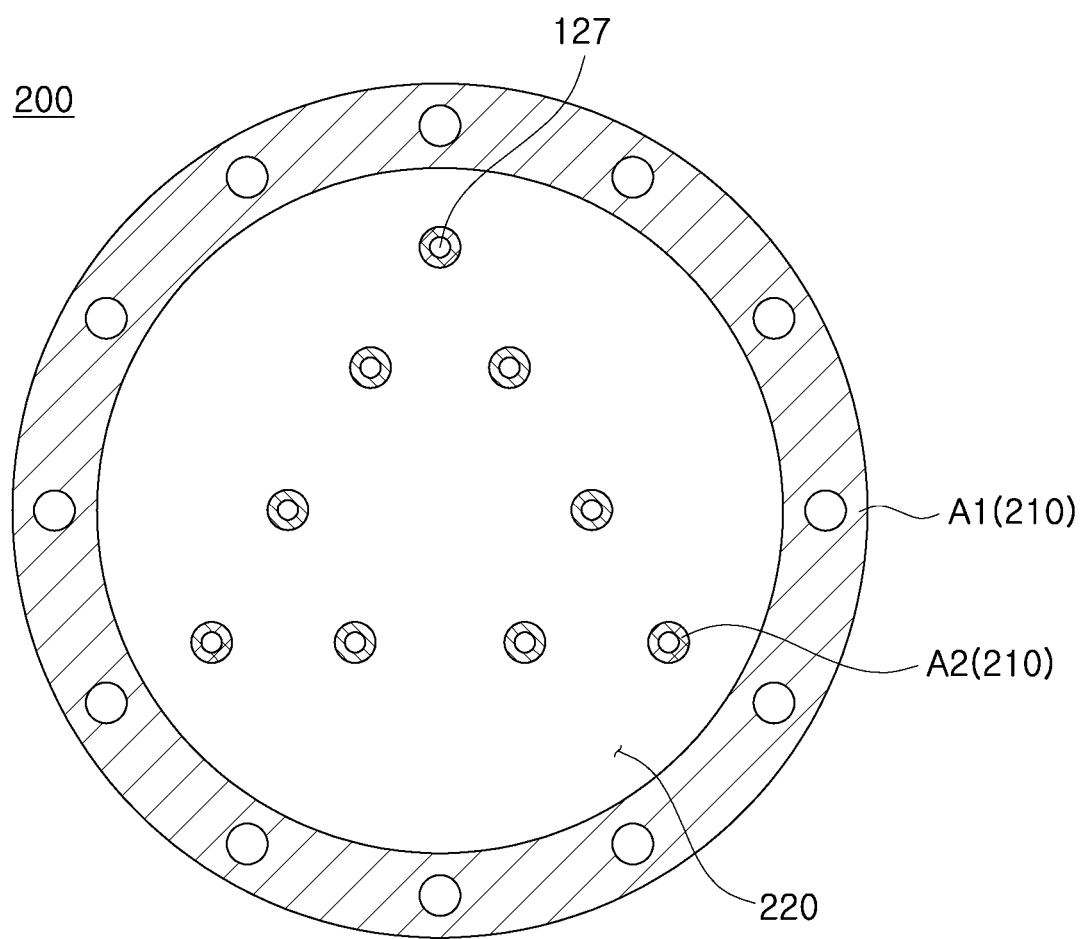
FIG. 5 is a plan view illustrating an embodiment of an intermediate layer of FIG. 3.

FIG. 5 is a plan view showing an embodiment of an intermediate layer in which a joining part 210 is formed in a partial region.

Referring to FIG. 5, the joining part 210 may include a region corresponding to an edge region of the base component 121. That is, the joining part 210 may include a ring-shaped first area A1 having the same outer diameter as the diameter of the base component 121. Due to the joining part 210 formed in the first area A1, a closed space blocked from the outside may be famed in the central region of the intermediate layer 200.

In addition, the joining part 210 may further include a second area A2 corresponding to a peripheral area surrounding the plurality of holes formed in the base component 121 and the chucking component 122. For example, the second area A2 may include annular areas, each having the same inner diameter as the pin hole 127 and enclosing the pin hole 127. Moreover, although not shown in detail, the second area A2 may further include an area corresponding to a peripheral area of a plurality of gas supply holes for supplying a heat transfer gas (e.g., helium gas) to the bottom surface of the substrate W. The second area A2 may include annular areas, each having the same inner diameter as the gas supply hole and enclosing the gas supply hole.

Due to the joining part 210 formed in the partial region, the intermediate layer 200 may include an enclosed space between the base component 121 and the chucking component 122. That is, a region of the intermediate layer 200 excluding the joining part 210 may include an inner space.

As described above, by forming the joining part 210 in a minimum area capable of bonding the base component 121 and the chucking component 122, thermal stress caused by a difference in coefficients of thermal expansion between the base component 121 and the chucking component 122 may be minimized. By minimizing the thermal stress due to the difference in the coefficients of thermal expansion, it is possible to prevent cracking and bending of the chucking component 122 due to the difference in thermal expansion.

The heat transfer part 220 may include an enclosed space formed in the intermediate layer 200 due to the joining part 210 formed in a partial region. That is, the base component 121 and the chucking component 122 may be spaced apart by the heat transfer part 220. Heat transfer characteristics of the intermediate layer 200 may be improved by injecting a heat transfer gas into the enclosed space.

In order to inject the heat transfer gas into the heat transfer part 220, at least one gas injection part 222 may be formed in the base component 121. The gas injection part 222 may be connected to a gas storage part 221 through a supply line. The heat transfer gas is stored in the gas storage part 221. The heat transfer gas includes inert gases. For example, the heat transfer gas may be a helium (He) gas. The helium gas may be supplied to the heat transfer part 220 through the gas injection part 222 and may fill the heat transfer part 220. The helium gas may serve as a medium through which cooling heat of the base component 121 is transferred to the chucking component 122. In addition, the thermal shock caused by the temperature difference between the base component 121 and the chucking component 122 may be further buffered by the thermal buffering effect.

The pressure of the helium gas injected into the heat transfer part 220 through the gas injection part 222 may be controlled by a controller 230. The controller 230 may be connected to the gas storage part 221 and control the flow rate of the helium gas supplied to each supply line. Accordingly, the pressure of the helium gas present in the heat transfer part 220 may be controlled.

Helium gas improves its thermal conductivity as the pressure increases. Therefore, it is possible to adjust the heat transfer performance by controlling the pressure of the helium gas.

Meanwhile, the heat transfer part 220 may be shaped in such a way that an area excluding the joining part 210 is under-cut to a depth of 0.1 mm to 1 mm.

Meanwhile, by dividing the heat transfer part 220 into a plurality of areas by expanding the area of the joining part 210, it is possible to easily adjust the heat transfer performance according to the area.

In this embodiment, the joining part 210 has been illustrated and described as including the metal film 211 and the filler 212 formed on the bottom surface of the chucking component 122. However, the joining part 210 may further include a second metal film formed on the upper surface of the base component 121 and formed in a region corresponding to the region where the metal film 211 is formed. In addition, the metal film 211 and the filler 212 may be formed in the form of a flat plate, but may also be formed in the form of a metal mesh having a mesh shape for smooth bonding.

Figure 6:
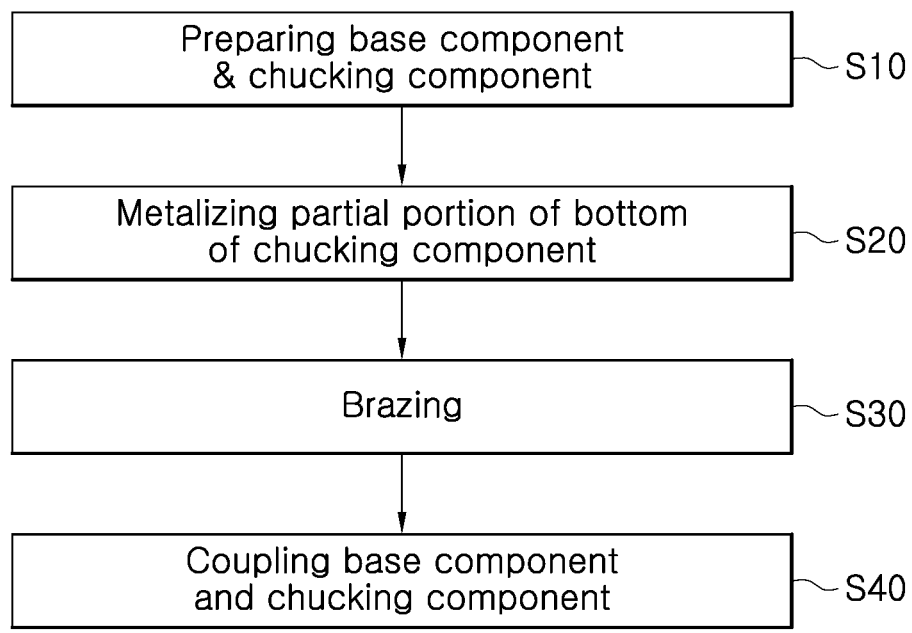
FIG. 6 is a flowchart illustrating a manufacturing method of the substrate support unit.

Hereinafter, a manufacturing method of the above-described substrate support unit will be described. FIG. 6 is a flowchart illustrating a manufacturing method of the substrate support unit 120 according to the embodiment of the present disclosure.

The manufacturing method of the substrate support unit according to the embodiment of the present disclosure may include steps of preparing (S10) the base component and the chucking component, metalizing (S20), brazing (S30), and coupling (S40) the base component and the chucking component.

In the step of preparing (S10) the base component and the chucking component, the base component 121 located in the lower portion and the chucking component 122 that is to be mounted on the base component 121 and includes a nonconductive material are prepared. The chucking component 122 supports the substrate W seated thereon by using electrostatic force. The chucking component 122 may be made from a ceramic material and provided as a ceramic plate or a ceramic puck, and may be coupled to the base component 121 so as to be fixed on the base component 121.

The step of preparing (S10) according to the embodiment of the present disclosure may include a step of forming a gas injection part 222 for supplying gas to a space between the base component 121 and the chucking component 122. The gas injection part 222 may be formed to pass through the base component 121. At least one gas injection part 222 passing through the base component 121 may be formed.

The step of metalizing (S20) may include a step of metalizing a partial region of the bottom surface of the chucking component. At this time, the partial region may be a minimum area in which the base component 121 and the chucking component 122 may be coupled and fixed. The step of metalizing (S20) may include a step of depositing a metal film 211 on the bottom surface of the chucking component 122 by vacuum deposition or plating. The metal film 211 may be formed by patterning on a partial region of the bottom surface of the chucking component 122. For example, the metal film 211 may be any one of aluminum (Al), copper (Cu), titanium (Ti), nickel (Ni), and silver (Ag) series. The step of metalizing (S20) may further include a step of metallizing a partial region of the upper surface of the base component.

The step of brazing (S30) is to couple the metalized region of the bottom surface of the chucking component 122 and the base component 121. The step of brazing (S30) may include a step of providing a filler 212 between the chucking component 122 and the base component 121, and a step of coupling the chucking component 122 and the base component 121 via the filler 212. As an example, the filler 212 may include aluminum (Al). Via the filler 212, the base component 121 may be coupled to a partial metalized region of the bottom surface of the chucking component 122 by a brazing process.

The brazing process will be described briefly. First, the filler 212 is inserted between the base component 121 and the chucking component 122 to be joined, and the filler 212 is heated to a temperature sufficient to melt, and then the molten filler 212 is cooled to form a strong joining part. The filler 212 may be formed of a metal having a lower melting point than that of the metal film 211 on the bottom surface of the chucking component 122 and that of the base component 121.

The base component 121 and the chucking component 122 may be coupled (S40) by the steps of metalizing (S20) and brazing (S30). As the base component 121 and the chucking component 122 are coupled by brazing, the substrate support unit 120 may have great heat resistance during a high-temperature process.

Meanwhile, in order to minimize the thermal stress caused by the difference in coefficients of thermal expansion between the base component 121 and the chucking component 122, the joining part 210 may be formed in a partial region between the base component 121 and the chucking component 122. The joining part 210 may be formed in a minimum area in which the base component 121 and the chucking component 122 may be coupled and fixed. The joining part 210 may include the first area A1 corresponding to an edge region of the base component 121, and the second area A2 corresponding to a peripheral area surrounding the plurality of holes formed in the base component 121 and the chucking component 122.

A heat transfer gas may be supplied to a space, formed between the base component 121 and the chucking component 122 by the first area A1, through the gas injection part 222. As an example, the heat transfer gas may be a helium (He) gas. The helium gas may fill the space formed between the base component 121 and the chucking component 122 by the first area A1. The helium gas may serve as a medium through which cooling heat of the base component 121 is transferred to the chucking component 122. In addition, the thermal shock caused by the temperature difference between the base component 121 and the chucking component 122 may be further buffered by the thermal buffering effect.

Furthermore, since the thermal conductivity of the helium gas improves as the pressure increases, the heat transfer performance may be adjusted by controlling the pressure of the helium gas injected into the space between the base component 121 and the chucking component 122 through the gas injection part 222. In addition, by dividing the heat transfer part 220 into a plurality of regions by expanding the region of the joining part 210, it is possible to easily adjust the heat transfer performance according to the region.

The above description is merely illustrative of the technical idea of the present disclosure, and various modifications and variations may be made by those skilled in the art to which the present disclosure pertains without departing from the essential characteristics of the present disclosure. Therefore, the embodiments described in the present disclosure are not intended to limit the technical spirit of the present disclosure, but to explain, and the technical spirit of the present disclosure is not limited by these embodiments. The protection scope of the present disclosure should be construed by the following claims, and all technical ideas within the scope equivalent thereto should be construed as being included in the scope of the present disclosure.

What is claimed is:

1. A manufacturing method of a substrate support unit for supporting a substrate, the method comprising:
    preparing a chucking component for supporting the substrate and a base component disposed under the chucking component; and
    coupling a partial region of a bottom surface of the chucking component and a corresponding partial region of an upper surface of the base component to each other by brazing,
    wherein the coupling comprises:
    forming a metal film on the partial region of the bottom surface of the chucking component by metalizing the partial region of the bottom surface of the chucking component; and
    providing, in the brazing, a metal filler between the chucking component and the base component, thereby forming a joining part by coupling the metal filler and the metal film with each other, wherein the metal filler directly contacts the corresponding partial region of the upper surface of the base component, and wherein the joining part includes a first area corresponding to an edge region of the base component and the chucking component and a second area surrounding a side surface of a pin hole passing through the base component and the chucking component.

2. The manufacturing method of claim 1, wherein the forming of the metal film comprises:

depositing the metal film on the partial region of the bottom surface of the chucking component by vacuum deposition or plating.

3. The manufacturing method of claim 1, wherein the preparing comprises:

forming at least one gas injection part for supplying a gas to a space between the base component and the chucking component.

4. The manufacturing method of claim 1, wherein the partial region includes a minimum area for coupling and fixing the base component and the chucking component.

5. A substrate support unit, comprising:

a base component;

a chucking component mounted on the base component; and an intermediate layer interposed between the base component and the chucking component, wherein the intermediate layer includes a joining part formed by brazing in a partial region to couple the base component and the chucking component to each other, wherein the joining part includes:

a metal film formed on a partial region of a bottom surface of the chucking component; and a metal filler provided between the metal film and an upper surface the base component, wherein the metal filler directly contacts the upper surface of the base component, and wherein the joining part includes a first area corresponding to an edge region of the base component and the chucking component and a second area surrounding a side surface of a pin hole passing through the base component and the chucking component.

6. The substrate support unit of claim 5, wherein the intermediate layer further includes a heat transfer part having an inner space formed by the joining part.

7. The substrate support unit of claim 6, wherein the base component is provided with a gas injection part for injecting a heat transfer gas into the heat transfer part.

8. The substrate support unit of claim 7, further comprising:

a controller configured to control pressure of the heat transfer gas injected into the heat transfer part through the gas injection part.

9. The substrate support unit of claim 8, wherein the heat transfer gas is a helium gas.

10. A substrate processing apparatus, comprising:

a housing;

a shower head unit installed inside the housing and configured to supply a process gas for processing a substrate into the housing;

a substrate support unit installed under the shower head unit inside the housing; and a plasma generation unit configured to generate plasma using the process gas to process the substrate, wherein the substrate support unit comprises:

a base component;

a chucking component mounted on the base component; and an intermediate layer between the base component and the chucking component, wherein the intermediate layer includes a joining part formed by brazing in a partial region to couple the base component and the chucking component to each other, wherein the joining part includes:

a metal film formed on a partial region of a bottom surface of the chucking component; and a metal filler provided between the metal film and an upper surface the base component, wherein the metal filler directly contacts the upper surface of the base component, and wherein the joining part includes a first area corresponding to an edge region of the base component and the chucking component and a second area surrounding a side surface of a pin hole passing through the base component and the chucking component.

11. The substrate processing apparatus of claim 10, wherein the intermediate layer further includes a heat transfer part having an inner space formed by the joining part.

12. The substrate processing apparatus of claim 11, wherein the base component is provided with a gas injection part for injecting a heat transfer gas into the heat transfer part.

13. The substrate processing apparatus of claim 12, further comprising:

a controller configured to control pressure of the heat transfer gas injected into the heat transfer part through the gas injection part.

* * * * *